US012773810B2

(12) United States Patent
Mizuma et al.

(10) Patent No.: US 12,773,810 B2
(45) Date of Patent: Oct. 27, 2026

(54) METHOD FOR PRODUCING RESIN MOLDED PRODUCT

(71) Applicant: TOWA CORPORATION, Kyoto (JP)

(72) Inventors: Keita Mizuma, Kyoto (JP); Hiroyuki Sakaguchi, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 352 days.

(21) Appl. No.: 18/538,095

(22) Filed: Dec. 13, 2023

(65) Prior Publication Data

US 2024/0116219 A1 Apr. 11, 2024

Related U.S. Application Data

(63) Continuation of application No. PCT/JP2022/016373, filed on Mar. 31, 2022.

(30) Foreign Application Priority Data

Jun. 14, 2021 (JP) ................................ 2021-099001

(51) Int. Cl.
*B29C 33/72* (2006.01)
*B29C 43/18* (2006.01)
(Continued)

(52) U.S. Cl.
CPC .............. *B29C 33/72* (2013.01); *B29C 43/18* (2013.01); *B29C 43/34* (2013.01);
(Continued)

(58) Field of Classification Search
CPC ...................................................... B29C 33/72
See application file for complete search history.

(56) References Cited

U.S. PATENT DOCUMENTS 4,670,329 A 6/1987 Pas
2002/0171173 A1 11/2002 Tsuchida
(Continued)

FOREIGN PATENT DOCUMENTS

CN 111823452 A 10/2020
EP 1813406 A1 8/2007
(Continued)

OTHER PUBLICATIONS

Kiyoshi Miyake and Sadayuki Okudaira, pp. 592-597, "Denki Kagaku" 50, No. 7, published by Hitachi, Ltd.
(Continued)

*Primary Examiner* — Benjamin A Schiffman
(74) *Attorney, Agent, or Firm* — Muncy, Geissler, Olds & Lowe, P.C.

(57) ABSTRACT

A method for producing a resin molded product comprises conveying a molding die maintenance member including a plate-like support and a molding die maintenance resin from a common storage to a molding die for resin molding including an upper die and a lower die, clamping the molding die in a state where the molding die maintenance member is placed between the upper die and the lower die of the molding die, performing maintenance by heating the molding die maintenance member after the clamping the molding die, conveying the molding die maintenance member from the molding die, conveying a substrate from the storage to the molding die, and clamping the molding die in a state where the substrate is placed between the upper die and the lower die of the molding die.

5 Claims, 4 Drawing Sheets

(51) Int. Cl.

| | |
|---|---|
| ***B29C 43/34*** | (2006.01) |
| ***B29C 45/17*** | (2006.01) |
| ***H10W 74/01*** | (2026.01) |
| *B29C 45/02* | (2006.01) |
| *B29C 45/14* | (2006.01) |

(52) U.S. Cl.

CPC ......... *B29C 45/1753* (2013.01); *H10W 74/01* (2026.01); *B29C 45/02* (2013.01); *B29C 45/14639* (2013.01)

(56) References Cited

U.S. PATENT DOCUMENTS

| | | | |
|---|---|---|---|
| 2007/0167097 | A1 | 7/2007 | Hiromitsu |
| 2022/0171173 | A1 | 6/2022 | Koga |
| 2022/0250285 | A1 | 8/2022 | Maeyama |

FOREIGN PATENT DOCUMENTS

| | | | |
|---|---|---|---|
| GB | 2298650 | A | 8/1998 |
| JP | S63-502497 | A | 9/1988 |
| JP | H11-198151 | A | 7/1999 |
| JP | 2003-276033 | A | 9/2003 |
| JP | 2005-313436 | A | 11/2005 |
| JP | 2007-196587 | A | 8/2007 |
| JP | 2007-301928 | A | 11/2007 |
| JP | 2008-213313 | A | 9/2008 |
| JP | 2009-018431 | A | 1/2009 |
| JP | 2021-082666 | A | 5/2021 |
| KR | 10-2019-0075797 | A | 7/2019 |
| SG | 188058 | A1 | 3/2013 |
| TW | 563211 | B | 11/2003 |
| TW | 200843927 | A | 11/2008 |
| TW | 201318806 | A | 5/2013 |
| WO | 96/05954 | A1 | 2/1996 |
| WO | 2005/115713 | A1 | 12/2005 |

OTHER PUBLICATIONS

Kenzo Ohkita et al., "UV Laser Releasable Temporary Bonding Materials for Fan-Out Wafer Level Package(FO-WLP)", JSR Technical Review No. 126/2019, pp. 18-25.

Office Action of the corresponding Taiwanese Patent Application No. 111114628 dated Nov. 2, 2022.

Decision of Rejection of the corresponding Taiwanese patent application No. 111114628 dated Mar. 22, 2023.

Office Action in the corresponding Korean patent application No. 10-2023-7042873 dated Dec. 10, 2025.

METHOD FOR PRODUCING RESIN MOLDED PRODUCT

CROSS REFERENCE TO RELATED APPLICATIONS

This application is a continuation of a national stage entry from a PCT application PCT/JP2022/016373 filed on Mar. 31, 2022, and which claims a priority to Japanese patent application, 2021-099001 filed on Jun. 14, 2021, the disclosures of which are incorporated herein by reference.

FIELD OF THE INVENTION

The present invention relates to a molding die maintenance member, a resin molding apparatus and a method for producing a resin molded product.

Resin molding technology is widely used to resin seal (resin mold) electronic elements such as ICs and semiconductor chips (hereinafter sometimes merely referred to as a "chip"). More specifically, for example, resin sealing a chip enables to produce an electronic component with the resin-sealed chip (also referred to as a package or an electronic component as a completed product, hereinafter sometimes merely referred to as an "electronic component").

Examples of a molding die maintenance member for resin molding used in a resin molding apparatus include cleaning members described in Patent Literatures 1 and 2.

DESCRIPTION OF RELATED ART

Patent Literature 1: JP-A-2007-301928
Patent Literature 2: JP-A-2009-018431

BRIEF SUMMARY OF THE INVENTION

Patent Literature 1 does not describe automatically conveying a cleaning member for supplying to a molding die. In other words, the cleaning member is manually supplied to the molding die. Accordingly, the inside of a resin molding apparatus is exposed by opening the apparatus during the supply of the cleaning member to the molding die. This operation risks contaminating inside the resin molding apparatus with contamination, even in a space with sufficient air cleanliness such as a clean room or a clean booth.

Patent Literature 2 describes separately and automatically supplying a cleaning substrate and a cleaning resin to a molding die. However, after molding for cleaning using the cleaning resin, it may be difficult to remove the remained cleaning resin stuck to the molding die. When using a releasability recovering resin as the molding die maintenance resin instead of the cleaning resin, it may also be difficult to remove the releasability recovering resin stuck to the molding die.

Hence, it is an object of the present invention to provide a molding die maintenance member configured to be automatically supplied to a molding die and to reduce or prevent remains of a molding die maintenance resin in the molding die, a resin molding apparatus, and a method for producing a resin molded product using the molding die maintenance member.

To achieve the above object, the present invention provides a molding die maintenance member including a support and a molding die maintenance resin, wherein the molding die maintenance resin is placed on at least one surface of the support.

The present invention also provides a rein molding apparatus including a molding die for resin molding and a conveying mechanism configured to convey the molding die maintenance member of the present invention to the molding die.

The present invention also provides a method for producing a resin molded product using a molding die, including performing maintenance of the molding die by supplying the molding die maintenance member of the present invention to the molding die and performing resin molding by supplying a resin molding object and a resin material to the molding die after the performing maintenance of the molding die.

The present invention can provide a molding die maintenance member configured to be automatically supplied to a molding die and to reduce or prevent remains of a molding die maintenance resin in the molding die, a resin molding apparatus, and a method for using a resin molded product using the molding die maintenance member.

Each of FIGS. 4A to 4D is a cross-sectional view showing an example of a shape of a recessed part in a roughened surface of a support in the molding die maintenance member of the present invention.

Figure 5:
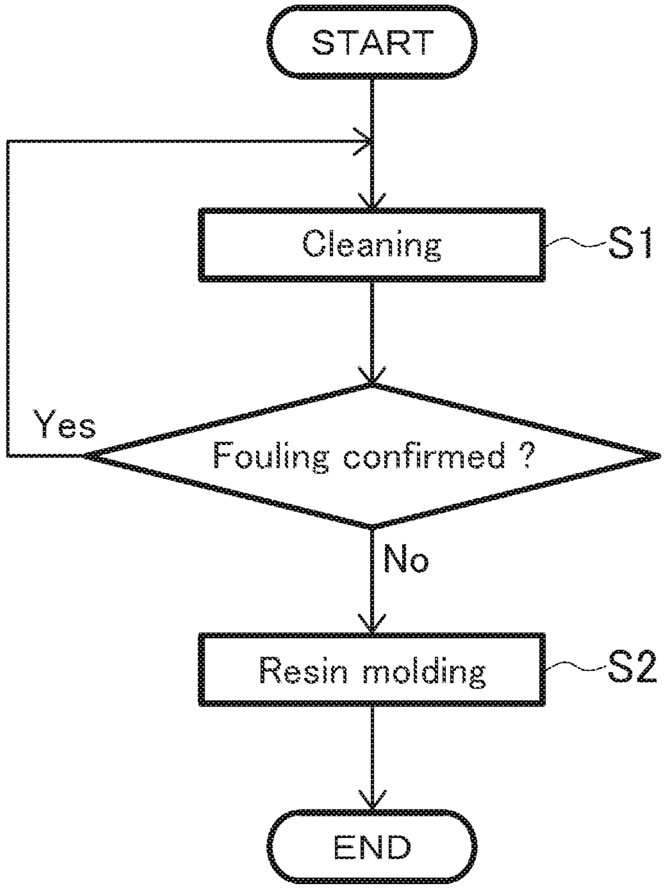

FIG. 5 is a flowchart showing an example of the method for producing the resin molded product of the present invention.

Figure 6:
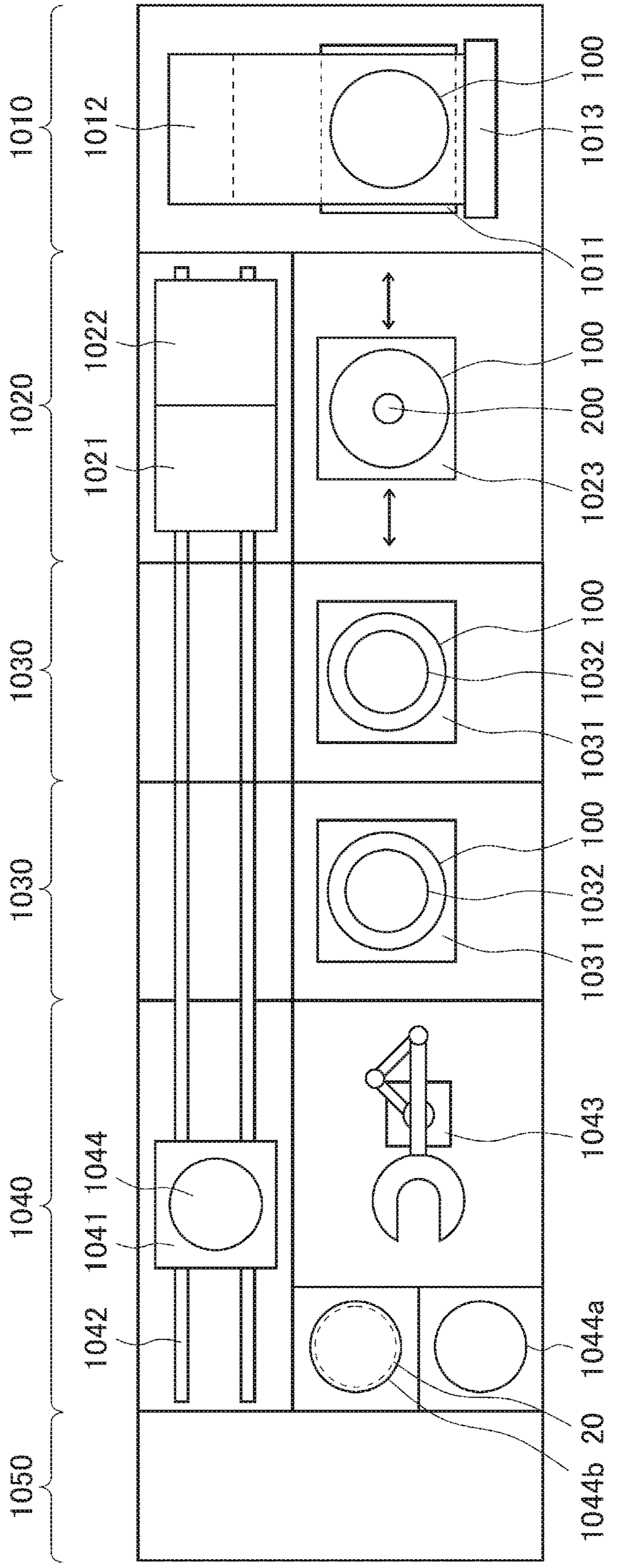

FIG. 6 is a plan view showing an example of an entire structure of the resin molding apparatus of the present invention.

DETAILED DESCRIPTION OF THE INVENTION

The present invention will be described more specifically below with reference to illustrative examples. It is to be noted, however, that the present invention is by no means limited by the following descriptions.

In the molding die maintenance member of the present invention, the support may be subjected to treatment for improving joint strength to the molding die maintenance resin, for example. The joint strength improving treatment may be a surface roughening treatment for roughening a molding die maintenance resin placement surface, for example. The surface roughening treatment may be, forming recessed parts on the molding die maintenance resin placement surface of the support, for example. The joint strength improving treatment may be an adhesive layer forming treatment for forming an adhesive layer on the molding die maintenance resin placement surface, for example.

The molding die maintenance member of the present invention may further include an adhesive layer, and the molding die maintenance resin may be adhered to at least one surface of the support via the adhesive layer, for example.

In the molding die maintenance member of the present invention, at least one surface of the support may be roughened, and the molding die maintenance resin may be placed on the roughened surface, for example.

In the molding die maintenance member of the present invention, the surface may be roughened by forming the recessed parts, for example. A diameter of a part inside the recessed part may be larger than a diameter of an opening of the recessed part.

In the molding die maintenance member of the present invention, the molding die maintenance resin may be a cleaning resin, for example.

In the molding die maintenance member of the present invention, the molding die maintenance resin may be a releasability recovering resin, for example.

In the performing maintenance of the molding die in the method for producing the resin molded product of the present invention, the molding die maintenance member of the present invention including a cleaning resin as the molding die maintenance resin may be supplied to the molding die to clean the molding die, and thereafter the molding die maintenance member of the present invention including a releasability recovering resin as the molding die maintenance resin may be supplied to the molding die to recover releasability of the molding die.

In the performing maintenance of the molding die in the method for producing the resin molded product of the present invention, the molding die maintenance member of the present invention including the cleaning resin as the molding die maintenance resin may be supplied to the molding die to clean the molding die, and thereafter, if the cleaning resin is fouled, again the molding die maintenance member including the cleaning resin as the molding die maintenance resin may be supplied to the molding die to clean the molding die, for example. If the cleaning resin is not fouled, the molding die maintenance member including the releasability recovering resin as the molding die maintenance resin may be supplied to the molding die to recover releasability of the molding die, or the performing resin molding may be done, for example.

In the present invention, placing "on a surface" may be placing directly in contact with the surface or placing via other members or the like without being directly in contact with the surface, for example. In the molding die maintenance member of the present invention, a state where the molding die maintenance resin is placed on a surface of the support may be, for example, a state where the molding die maintenance resin is directly in contact with the surface of the support, or a state where the molding die maintenance resin is placed via other members or the like without being directly in contact with the surface of the support. The state where the molding die maintenance resin is placed via other members or the like without being directly in contact with the surface of the support is not particularly limited and may be a state where the molding die maintenance resin is adhered to the surface of the support via the adhesive layer, for example.

The molding die of the present invention is not particularly limited and may be for example, a metal die, a ceramic die, and the like.

In the present invention, the resin molded product is not particularly limited and may be a resin-sealed chip as an electronic component, for example. In general, an "electronic component" may refer to a chip before resin sealing or a resin-sealed chip. However, in the present invention, the chip is referred to as an "electronic element" and the resin-sealed chip as the electronic component (electronic component as a completed product) is referred to as the "electronic component". In the present invention, the "chip" is synonymous with the "electronic element". In the present invention, the "chip" or the "electronic element" is referred to as the chip before resin sealing, and specific examples thereof include a chip such as an IC, a semiconductor chip, a semiconductor element for controlling electricity, a resistive element, and a capacitor element. The "semiconductor element" is a circuit element made of a semiconductor, for example. In the present invention, the chip before resin sealing is called the "chip" or the "electronic element" for convenience, for distinction between the resin-sealed electronic component. However, the "chip" or the "electronic element" of the present invention is not particularly limited and may not be chip-like, as long as being the chip before resin sealing.

In the present invention, a resin material before molding and resin after molding are not particularly limited and may be, for example, thermosetting resins such as an epoxy resin and a silicone resin, and thermoplastic resins. The resin material before molding and the resin after molding may also be composite materials partially containing the thermosetting resin or the thermoplastic resin. In the present invention, examples of a form of the resin material before molding include a powdery resin (including granular resin), a liquid resin, a sheet-like resin, and a tablet-like resin. Note that, in the present invention, the liquid resin may be liquid at normal temperature, or may be a molten resin melted and liquidized by being heated. The resin may be other forms, as long as being able to be supplied to a cavity, a pot and the like of the molding die.

In the method for producing the resin molded product of the present invention, a resin molding method is not particularly limited and may be, for example, transfer molding, injection molding, compression molding, and the like.

The examples of the present invention are described below with reference to the drawings. Each drawing is schematically illustrated by appropriately omitting, exaggerating, and the like for convenience in explanation.

EXAMPLES

The present example will describe examples of the molding die maintenance member, the resin molding apparatus and the method for producing the resin molded product of the present invention.

[1. Molding Die Maintenance Member]

Figure 1:
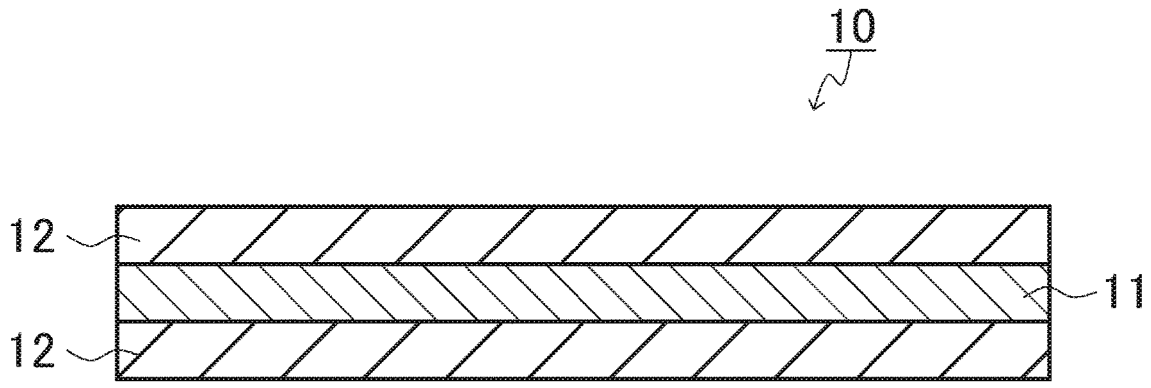
FIG. 1 is a cross-sectional view showing an example of a structure of the molding die maintenance member of the present invention.

The cross-sectional view of FIG. 1 shows an example of the molding die maintenance member of the present invention. As shown in FIG. 1, in this molding die maintenance member 10, molding die maintenance resins 12 are placed on both faces of a plate-like support 11. In FIG. 1, the molding die maintenance resin 12 is directly in contact with both faces of the support 11.

A material of the support 11 is not particularly limited and preferred to be, for example, a material which is hardly deteriorated by heat of the maintenance of the molding die or the like. Examples of the material of the support 11 include metal, glass, silicone, a glass epoxy material, a resin material, ceramics, and the like. The metal is not particularly limited and may be, for example, copper or the like. The glass epoxy material is an epoxy plate including glass fibers and may be the same as a glass epoxy substrate used for a printed substrate, for example. The resin material is not particularly limited and may be, for example, an epoxy plate or the like.

A shape of the support 11 is not particularly limited either and may be, for example, a shape which fits to a shape of a cavity of the molding die. The shape of the support 11 may be, for example, a round shape, a rectangular shape, and the like in a plan view (seen from above or below the molding die maintenance member in FIG. 1). A form of the support 11 is not limited to a plate, and may be a block or the like. However, the support 11 is preferred to be plate-like as in the present example from the viewpoints of usability, costs, productivity, and the like. The thickness of the support 11 is not particularly limited either and can be appropriately set depending on strength of the support 11, costs, and the like.

The molding die maintenance resin 12 is not particularly limited and may be, for example, a cleaning resin or a releasability recovering resin. Thickness, a form, and the like of the molding die maintenance resin 12 are not particularly limited and can be appropriately set depending on thickness, a form, and the like of a cavity of the molding die, for example.

In the present invention, the cleaning resin is not particularly limited and may be, for example, a common molding die cleaning resin. The cleaning resin may be, for example, a melamine resin or the like. The melamine resin may include a melamine-formaldehyde resin, for example. One kind of the cleaning resin can be used, or two or more kinds of the cleaning resins can be used in combination. The cleaning resin may be a commercial product or a self-prepared product, for example. The cleaning resin may be self-prepared in the same way as or based on a method for producing a cleaning resin composition or a method for producing a sheet-like metal die cleaner using the cleaning resin composition described in examples of WO2005/115713A1. A method for producing the melamine resin or the melamine-formaldehyde resin may be the same as a method for producing the releasability recovering resin described below, for example.

The color of the cleaning resin is not particularly limited and preferred to be white or pale color close to white such as grey or the like, for example. This enables to easily perform a visual check of deposit (such as a fouling or the like) removed from the molding die and stuck to the cleaning resin after cleaning the molding die, and thus enables to easily evaluate surface condition (cleanliness, foul condition, and the like) of the cavity of the molding die, for example.

In the present invention, the releasability recovering resin is not particularly limited and may be, for example, a common releasability recovering resin. The releasability recovering resin may be a commercial product or a self-prepared product, for example. One kind of the releasability recovering resin can be used, or two or more kinds of the releasability recovering resins can be used in combination. In the present invention, the releasability recovering resin may be the same as, or appropriately selected based on a releasability recoverer described in WO2005/115713A1.

In the present invention, the releasability recovering resin is not particularly limited and may be, for example, a thermosetting resin such as a melamine resin, an epoxy resin, a phenolic resin, or the like. Among these kinds of resins, the melamine resin is useful from the viewpoint of curability or the like. The melamine resin is a resin made of triazines such as melamine methylolated with formaldehyde or the like, and may be a melamine-formaldehyde resin, for example. The melamine-formaldehyde resin is in a form of aqueous solution before being produced, for example. Specifically for example, a powdery resin is obtained by drying the aqueous solution by spray-drying or the like, a granular resin is obtained by mixing pulp into the aqueous solution and drying the mixed aqueous solution, and a tablet-like resin is obtained by tableting the powdery resin or the granular resin. A sheet-like resin is obtained by impregnating a sheet-like base material with the aqueous solution of the melamine-formaldehyde resin and drying the impregnated base material. A plate-like resin can be obtained by tableting the powdery resin or the granular resin using a tableting machine, for example. When impregnating the sheet-like base material, the sheet-like resin can be produced merely by making the base material to pass through the aqueous solution of the melamine-formaldehyde resin, and drying the base material passed through. An impregnation rate of the resin into the base material can be controlled to be the intended rate by changing the kind of the base material, adjusting concentration of the resin solution, or wringing the resin from the impregnated base material with adjusted degree. The impregnation rate can also be controlled by adjusting curability or flowability of the resin. In the present invention, the releasability recovering resin may be, for example, the above-described resin containing a releasing agent. The releasing agent is not particularly limited and may be a common releasing agent, for example. Examples of the releasing agent include long-chain fatty acids such as behenic acid and stearic acid, metal salts of the long-chain fatty acids such as zinc stearate and calcium stearate, ester wax such as carnauba wax, montan wax or partially saponified ester of montanic acid, a long-chain fatty acid amide such as stearyl ethylenediamine, paraffins such as polyethylene wax. Content rates of these releasing agents are not particularly limited and may be, for example, around 0.5 to 20 pts. mass or around 1 to 5 pts. mass to 100 pts. mass of the resin (the above-described thermosetting resin, for example). To efficiently perform releasability recovery work, an amount of the releasing agent is preferred to be not too small. From the viewpoint of reducing or preventing appearance failure of the resin molded product, the amount of the releasing agent is preferred to be not too large. In the present invention, a method for producing the releasability recovering resin is not particularly limited and may include, for example, combining the thermosetting resin, the releasing agent and other additives (a lubricant, mineral powder, a curing catalyst, and the like, for example) as needed. Thus-obtained compound may be mixed to be uniform by a kneader, a ribbon blender, a Henschel mixer, a ball mill and the like, for example. The releasability recovering resin can also be produced by adding the releasing agent to the aqueous solution of the melamine resin, for example.

In the molding die maintenance member of the present invention, for example, the support may be subjected to the treatment for improving joint strength to the molding die maintenance resin, as described above. The joint strength improving treatment may be, for example, the surface roughening treatment for roughening the molding die maintenance resin placement surface, or the adhesive layer forming treatment for forming the adhesive layer on the molding die maintenance resin placement surface, as described above. Performing such joint strength improving treatment can prevent the molding die maintenance member from separating from the support more effectively, and also can reduce or prevent the remains of the molding die maintenance resin in the molding die. The support and the molding die maintenance member subjected to such joint strength improving treatment are not particularly limited and as shown in examples of FIGS. 2 and 3 described below, for example.

Figure 2:
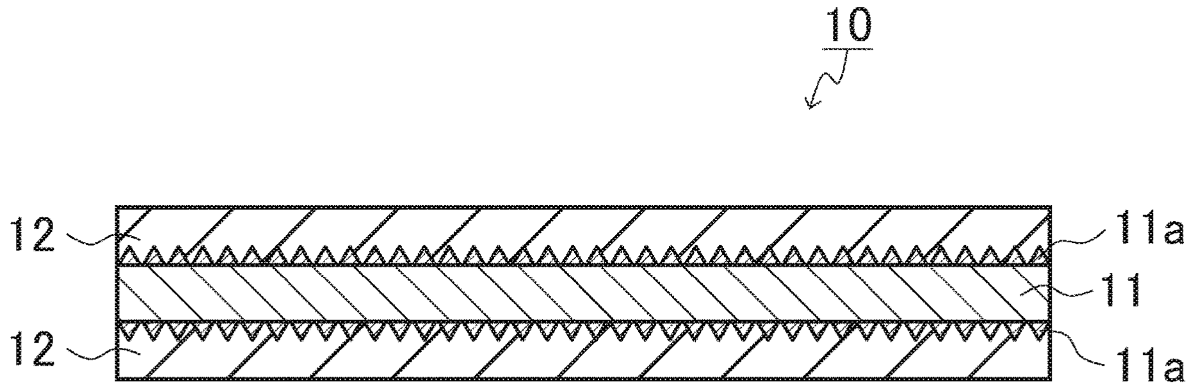
FIG. 2 is a cross-sectional view showing another example of a structure of the molding die maintenance member of the present invention.

The cross-sectional view of FIG. 2 shows another example of the molding die maintenance member of the present invention. As shown in FIG. 2, this molding die maintenance member 10 is the same as the molding die maintenance member 10 of FIG. 1 except that both faces of the plate-like support 11 are roughened surfaces 11*a*. In FIG. 2, the molding die maintenance resin 12 is directly in contact with the roughened surface 11*a* of the support 11. A method for roughening the surface of the support 11 and condition of the roughened surface 11*a* will be described below with illustrative examples.

Figure 3:
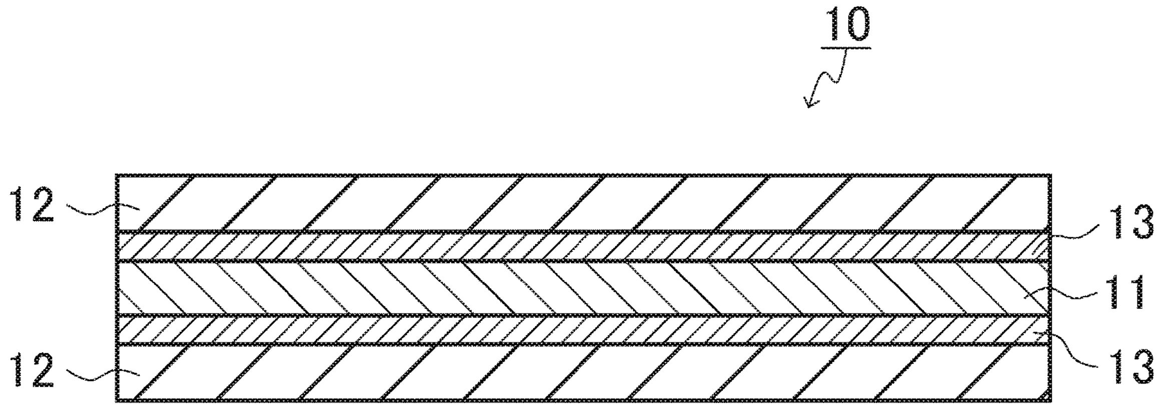
FIG. 3 is a cross-sectional view showing another example of a structure of the molding die maintenance member of the present invention.

The cross-sectional view of FIG. 3 shows another example of the molding die maintenance member of the present invention. As shown in FIG. 3, this molding die maintenance member 10 includes an adhesive layer 13, and the molding die maintenance resin 12 is adhered to both faces of the support 11 via the adhesive layer 13. Except for this, the molding die maintenance member 10 of FIG. 3 is the same as the molding die maintenance member 10 of FIG. 1.

A material of the adhesive layer 13 is not particularly limited and may be made of a common adhesive agent or the like, for example. The material of the adhesive layer 13 is preferred to have enough adhesive force to be adhered to the support 11 and the molding die maintenance resin 12, and to have adhesive force which is hardly degraded by heat of the molding die or the like, for example. A specific example of the material of the adhesive layer 13 includes an epoxy thermosetting resin or the like. Thickness of the adhesive layer 13 is not particularly limited and may be appropriately set depending on the adhesive force, costs, and the like, for example. In FIG. 3, the surface of the support 11 may be the roughened surface 11*a* similarly to FIG. 2, and the adhesive layer 13 may be laminated on the roughened surface 11*a*, for example.

In FIG. 2, a surface roughening treatment method for preparing the roughened surface 11*a* by roughening the surface of the support 11 is not particularly limited, and a common surface roughening treatment method can be appropriately used, for example. The surface roughening treatment method may be appropriately selected depending on a material of the support 11 or the like, for example. Examples of the surface roughening treatment method for the support 11 include blast treatment, wet etching, dry etching, plasma treatment, treatment using roughening agent, grinding, and film forming treatment by plating or the like. The blast treatment is performed by spraying a polishing agent to the support 11, thereby the surface of the support 11 can be roughened, for example. The wet etching is performed by immersing the support 11 into etching liquid, thereby the surface of the support 11 can be roughened for example. The etching liquid is not particularly limited and may be appropriately selected depending on the material of the support 11 (for example, the metal, the glass, the semiconductor and the like described above), for example. When the support 11 is a silicon wafer, irregular structure may be formed on the surface of the silicon wafer by anisotropic etching using an alkali aqueous solution as the etching liquid, to roughen the surface of the support 11, for example. The dry etching is performed by irradiating the support 11 with plasma in a vacuum apparatus, thereby the surface of the support 11 can be roughened, for example. Note that, the wet etching and the dry etching may use or may not necessarily use an etching mask (a photoresist mask, a metal mask and the like, for example), for example. The plasma treatment is performed by a method such as irradiating the support 11 with plasma in an atmosphere of atmospheric pressure, thereby the surface of the support 11 can be roughened. The treatment using the roughening agent is performed by a method such as applying the roughening agent to the surface of the support 11, thereby the surface of the support 11 can be roughened, for example. The grinding is performed using a grinder or the like, thereby the surface of the support 11 can be physically roughened, for example. The film forming treatment by plating or the like is performed by forming a roughened layer (film) on the surface of the support 11 by plating or the like, thereby the surface of the support 11 can be roughened, for example.

A configuration of the roughened surface 11*a* of the support 11 is not particularly limited and may be, for example, roughened by forming the recessed parts, as described above. A shape of the recessed part is not particularly limited either and may be, for example, a ditch or a hole. Also, a diameter of a part inside the recessed part may be larger than the diameter of the opening of the recessed part, as described above.

The surface roughening by forming the recessed parts using the etching mask will be described below with reference to illustrative examples. Firstly, a mask designed with a pattern for forming the recessed parts (the ditches or the holes, for example) is placed on the upper surface of the support 11 made of silicone or the like. The mask is not particularly limited and may be, for example, the photoresist, the metal mask, and the like, as described above. Then, the upper surface of the support 11 with the mask placed thereon is etched. The dry etching can be used to perform the etching, for example. The etching may be conditioned to shape the surface, for example, in a shape having a larger diameter in a cross-sectional view in a wall part inside the recessed part (the ditch or the hole) than the opening of the recessed part, such as an inverted trapezoidal shape (inverted tapered shape) or the like. A method for controlling the shape of the recessed part is not particularly limited and for example, a known method may be used to appropriately control the shape of the recessed part. Specifically for example, the condition of the etching may be controlled to control the shape of the recessed part. For example, "Fine Processing by Dry Etching" (publisher: Hitachi, Ltd.), pages 592 to 597 in "DENKI KAGAKU" 50, No. 7 (1982) describes that the shape of the section of the etched recessed part can be freely controlled to be a vertical ditch, a trapezoidal shape (taper shape), or the inverted trapezoidal shape (inverted taper shape), by controlling the condition of the dry etching. For a method for the controlling, it is also described that control of a rate of the anisotropic etching and isotropic etching enables to create the intended shape of the section, for example.

Figure 4A:
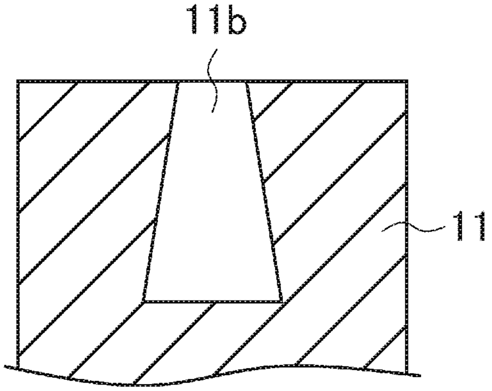
Figure 4B:
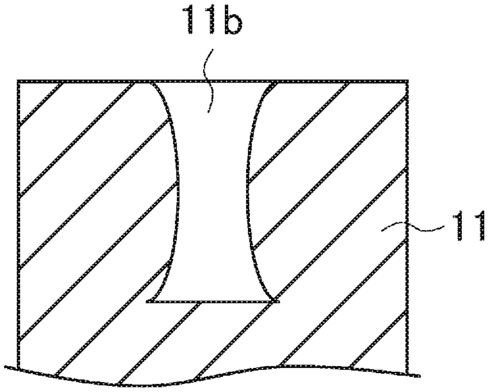
Figure 4C:
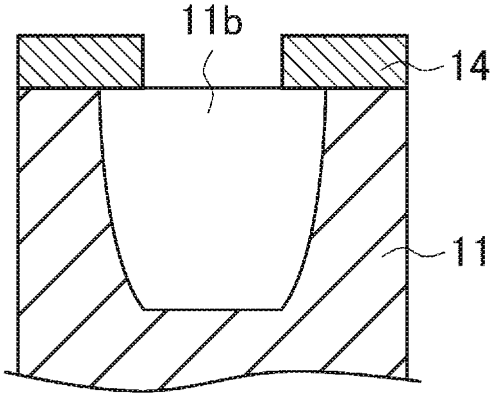
Figure 4D:
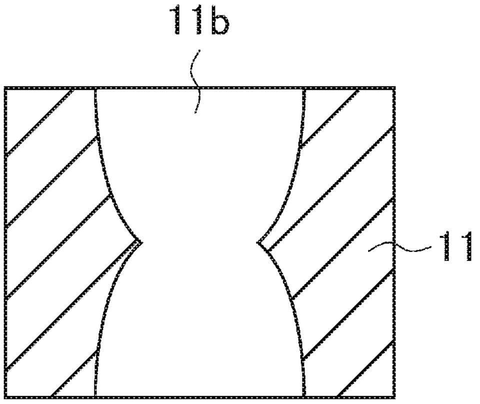

Each of the cross-sectional views of FIGS. 4A to 4D shows an example of a shape of the roughened surface 11*a* of the support 11 of FIG. 2. FIGS. 4A to 4D are all longitudinal-sectional views (seen from the same direction as in FIG. 2) of the surface 11*a* of the support 11. While all of FIGS. 4A to 4D are examples of the support 11 with the surface roughened by forming recessed parts 11*b* on the surface, shapes of the recessed parts 11*b* are different from each other. FIG. 4A is an example of the recessed part 11*b* shaped in the inverted trapezoidal shape (inverted taper shape). FIG. 4B is an example of the recessed part 11*b* shaped to have a narrowed part with a round curved wall between the bottom and the opening. In each of FIGS. 4A and 4B, a diameter of a part inside the recessed part 11*b* is larger than a diameter of the opening of the recessed part 11*b*. Although each of FIGS. 4A and 4B is structured with the etching mask being removed from the support 11, as shown in FIG. 4C, an etching mask 14 may not necessarily be removed from the support 11 and may be placed on the support 11. In FIG. 4C, the etching mask 14 covers the opening of the recessed part 11*b*, and thus a diameter of a part inside the recessed part 11*b* is larger than a diameter of the opening of the recessed part 11*b*. The material of the support 11, a type of the etching (the wet etching, the dry etching and the like, for example) and the like for shaping the recessed part 11*b* as shown in FIGS. 4A to 4C are not particularly limited and may be freely selected. The method for controlling the shape of the recessed part 11*b* is not particularly limited and is as described above. Also as shown in FIG. 4D, the recessed part 11*b* may be a through hole penetrating from one side (surface) to the other side (surface) of the support 11. A method for forming such a through hole is not particularly limited and may be, for example, placing the mask on both of the top and the bottom surface of the support 11 and etching the both faces.

The molding die maintenance member of the present invention may be disposable or reusable. Reusing the molding die maintenance member may be, for example, replacing a used molding die maintenance resin with a new molding die maintenance resin and reusing only the support. For the replacement, a separation layer may be provided to easily separate the molding die maintenance resin from the support, for example. The separation layer may be provided between, for example, the support 11 and the molding die maintenance resin 12 of FIG. 1, the roughened surface 11*a* and the molding die maintenance resin 12 of FIG. 2, the support 11 and the adhesive layer 13 of FIG. 3, or the adhesive layer 13 and the molding die maintenance resin 12 of FIG. 3, and the like. The separation layer needs to be formed not to make the molding die maintenance resin 12 to separate from the support 11 during the use of the molding die maintenance member 10, but to enable the molding die maintenance resin 12 to separate from the support 11 after the use of the molding die maintenance member 10. With this view, the separation layer should be formed using a material which can be decomposed after the use of the molding die maintenance member 10, for example. A method for decomposing the separation layer is not particularly limited and may be, for example, UV (ultraviolet light) laser irradiation, treatment with chemicals, releasing by heating, and the like. Among these methods, the UV laser irradiation is preferable as being simple and efficient. A material of the separation layer may be a photosetting resin, for example. The photosetting resin is not particularly limited and may be a resin which can be cured by irradiation with visible light or invisible light such as infrared light or UV light. The photosetting resin may be, for example, resin used for FO-WLP technology described in "UV Laser Releasable Temporary Bonding Materials for Fan-Out Wafer Level Package (FO-WLP)" (publisher: JSR Corporation), pages 18 to 25 in JSR TECHNICAL REVIEW No. 126/2019. Specifically, the reference describes adhering a glass carrier wafer and an EMC (Epoxy Molding Compound, i.e., an epoxy resin sealing material) wafer via an adhesive layer, and placing a separation layer material between the adhesive layer and the glass carrier wafer. The reference also describes irradiating the separation layer with UV laser, thereby smoothly separating the adhered wafer without heating or applying force. The reference also describes that an aromatic polymer in which a functional group having extremely high UV absorption is introduced into a main chain was used as the material of the separation layer.

[2. Method for Producing Resin Molded Product]

As described above, the method for producing the resin molded product of the present invention uses the molding die and includes the performing maintenance of the molding die by supplying the molding die maintenance member of the present invention to the molding die, and the performing resin molding by supplying a resin molding object and a resin material to the molding die after the performing maintenance of the molding die.

A method for the performing maintenance of the molding die is not particularly limited and may be, for example, supplying the molding die maintenance member of the present invention to a die cavity of the molding die, and performing preforming in the die cavity. A preforming method is not particularly limited and may be, for example, the same as a preforming method using a common cleaning resin or a releasability recovering resin. Specifically, the preforming can be performed by clamping and heating the molding die, for example. Thereby, the maintenance of the molding die (cleaning the molding die, or recovering releasability of the molding die, for example) can be performed. In the present invention, when performing the preforming, the temperature of the molding die, the time for the preforming, and the like are not particularly limited and maybe appropriately set similarly to or based on a preforming method using a common cleaning resin or a releasability recovering resin, for example. However, the molding die maintenance member of the present invention is integrated with the support and the molding die maintenance resin, as described above. Thereby, the method for producing the resin molded product of the present invention brings about advantageous effects that the molding die maintenance member can be automatically supplied to the molding die, and the remains of the molding die maintenance resin in the molding die can be reduced or prevented, as described above.

As described above, when manually supplying the cleaning member to the molding die, the inside of the resin molding apparatus is opened and exposed during the supply of the cleaning member to the molding die. This operation risks contaminating inside the resin molding apparatus with contamination, even in a space with sufficient air cleanliness such as a clean room or a clean booth. The method for producing the resin molded product of the present invention can solve such a problem by enabling the automatic supply of the molding die maintenance member to the molding die.

In the method for producing the resin molded product of the present invention, the performing resin molding by supplying the resin molding object and the resin material to the molding die after the performing maintenance of the molding die is not particularly limited and may be performed under the same conditions as a common resin molding method, for example. A method for the performing resin molding is not particularly limited and may be, for example, compression molding, transfer molding, injection molding and the like, as described above. The performing resin molding in the method for producing the resin molded product of the present invention may not necessarily use a releasing film, for example. In particular, increasing releasability of the molding die by supplying the molding die maintenance member of the present invention including the releasability recovering resin as the molding die maintenance resin to the molding die enables to perform the resin molding without using the releasing film. However, the performing resin molding in the method for producing the resin molded product of the present invention is not limited thereto and may use the releasing film, for example.

In the method for producing the resin molded product of the present invention, the performing resin molding is not particularly limited and may be, for example, the same as or based on a common method for producing the resin molded product. In the method for producing the resin molded product of the present invention, when the resin molding method is the compression molding, the performing resin molding may be done as follows, for example. Firstly, the resin molding object is set to the molding die having an upper die and a lower die while the resin material is supplied into the die cavity of the molding die. The resin molding object is not particularly limited and may be, for example, a substrate equipped with a chip, or the like. Then, the resin material in the die cavity is liquidized or fluidized. The resin material may be liquid or fluid before being supplied to the die cavity, or may be liquidized or fluidized by being heated and melted in the die cavity, or the like, for example. Thereafter the upper die and the lower die of the molding die are clamped. Thereby, a chip or the like attached to the resin molding object is immersed in the resin material in the die cavity, and the resin material in the die cavity can be pressed, for example. Then, the resin material is solidified (cured by heating, for example) in the die cavity. Thereby, the resin molded product is formed. The upper die and the lower die are opened to take out the resin molded product. In this way, the performing resin molding can be done. While this is an example of the performing resin molding using the compression molding, in the present invention, the performing resin molding using the compression molding is not limited thereto and may be any method, and for example, may be the same as or based on a common compression molding method. In the present invention, the resin molding method is not particularly limited as described above and may be, for example, the compression molding, the transfer molding, the injection molding, and the like. In the present invention, the performing resin molding using the transfer molding, the injection molding and the like is not particularly limited and may be, for example, the same as or based on common transfer molding, injection molding, and the like.

In the performing maintenance of the molding die in the method for producing the resin molded product of the present invention, for example, the molding die maintenance member of the present invention including the cleaning resin as the molding die maintenance resin may be supplied to the molding die to clean the molding die, and thereafter, the molding die maintenance member of the present invention including the releasability recovering resin as the molding die maintenance resin may be supplied to the molding die to recover releasability of the molding die.

In the performing maintenance of the molding die in the method for producing the resin molded product of the present invention, for example, the molding die maintenance member of the present invention including the cleaning resin as the molding die maintenance resin may be supplied to the molding die to clean the molding die, and thereafter, if the cleaning resin is fouled, the molding die maintenance member of the present invention including the cleaning resin as the molding die maintenance resin may be supplied again to the molding die to clean the molding die, and if the cleaning resin is not fouled, the molding die maintenance member of the present invention including the releasability recovering resin as the molding die maintenance resin may be supplied to the molding die to recover releasability of the molding die, as described above. The flowchart of FIG. 5 shows an example of such a method for producing the resin molded product. Firstly, as shown in a step S1 in FIG. 5, the molding die maintenance member of the present invention including the cleaning resin as the molding die maintenance resin is supplied to the molding die to clean the molding die. This step S1 corresponds to the “performing maintenance of the molding die” in the method for producing the resin molded product of the present invention. After the step S1, if the cleaning resin is fouled, the step S1 is performed again. After the step S1, if the cleaning resin is not fouled, as shown in a step S2, the “performing resin molding” in the method for producing the resin molded product of the present invention is done. The resin molded product can be produced by performing the method for producing the resin molded product of the present invention in this way. In this case, for example, the color of the cleaning resin is preferred to be white or pale color close to white such as grey or the like, as described above. As described above, this enables to easily perform a visual check of deposit (such as a fouling or the like) removed from the molding die and stuck to the cleaning resin, and thus enables to easily evaluate the surface condition (cleanliness, foul condition, and the like) of the cavity of the molding die, for example. Note that, in the present invention, a method for determining whether the cleaning resin is “fouled” or “not fouled” is not particularly limited and may be, for example, determining by the visual check, or by imaging the cleaning member and processing the image to determine whether the cleaning member is “fouled” or “not fouled” according to an amount of the deposit, presence of a transfer mark of a foreign substance. Determining with the image is more preferable than determining with the visual check, from viewpoints of enabling an observation of the cleaning resin with no interference in the resin molding apparatus, and accuracy of the determination.

Checking the remains of the foreign substance (such as a fouling or the like, for example) in the molding die by directly viewing the molding die may be difficult, because it is difficult to visually check all of the area in the molding die within a limited space. Such a problem can be solved in the determination of observing the deposit, the transfer mark of the foreign substance, and the like on the cleaning resin instead of directly viewing the molding die to check the remains of the foreign substance in the molding die. Note that, when a work (the resin molding object) is a fine work such as a wafer or the like which is fragile, presence of the foreign substance even with a slight amount in the molding die damages the fine work. However, the present invention enables to determine the presence of the foreign substance in the molding die by checking not only the deposit but also the transfer mark of the foreign substance on the cleaning resin. For this, the present invention enables to remove even a slight amount of a foreign substance in the molding die, and thus can reduce the damage to the fine work. Further, the present invention enables to supply the molding die maintenance member to the molding die not manually but automatically, so that the molding die maintenance member can be supplied to the molding die without exposing the inside of the molding die, as described above. Accordingly, the present invention enables to reduce or prevent entering of the foreign substance such as contamination or the like into the molding die.

The flowchart of FIG. 5 shows an example of performing the step S2 (resin molding) immediately after performing the step S1 (cleaning the molding die). However, the flow is not limited thereto and for example, recovering releasability of the molding die (preforming using the releasability recovering resin) may be performed after cleaning the molding die and before the performing resin molding, as described above.

[3. Resin Molding Apparatus]

The resin molding apparatus of the present invention includes the molding die for resin molding, and a conveying mechanism configured to convey the molding die maintenance member of the present invention to the molding die, as described above. Except for these, the resin molding apparatus of the present invention is not particularly limited, and for example, as follows.

(1) Entire Structure of Resin Molding Apparatus

The plan view of FIG. 6 schematically shows an example of a structure of the resin molding apparatus of the present invention. The resin molding apparatus shown in FIG. 6 is for producing an electronic component (resin molded product). As shown in FIG. 6, from the right side, a releasing film cutting module (releasing film cutting mechanism) 1010, an ejection module 1020, a compression molding module (compression molding mechanism) 1030, a conveying module (conveying mechanism) 1040 and a controller 1050 are placed in this order in the apparatus. Each of the modules is separately placed and the adjacent modules are mutually detachable. The ejection module 1020 includes an ejection mechanism configured to eject the resin material for resin molding to an ejection area on the releasing film (the ejecting object), as described below. The resin material is not particularly limited and may be, for example, a liquid resin or a granular resin.

The releasing film cutting module (releasing film cutting mechanism) 1010 can cut out a round-shaped releasing film from a rectangular-shaped releasing film. As shown in FIG. 6, the releasing film cutting module 1010 includes a film fixation base mounting mechanism 1011, a rolled releasing film 1012 and a film gripper 1013. A table (not shown) is mounted on the upper surface of the film fixation base mounting mechanism 1011. The table is a fixation base for fixing the releasing film 100, and is referred to as a "film fixation base". As shown in FIG. 6, the end of the releasing film is pulled out from the rolled releasing film 1012, and set so as to cover the table mounted on the film fixation base mounting mechanism 1011, thereby the releasing film can be fixed on the table. The film gripper 1013 can pull out the releasing film from the rolled releasing film 1012, and fix the end of the releasing film pulled out, to a side of the film fixation base mounting mechanism 1011 opposite to the rolled releasing film 1012. On the film fixation base mounting mechanism 1011, a cutter (not shown) can cut the releasing film to form a round-shaped releasing film 100. The releasing film cutting module 1010 includes a waste treatment mechanism (not shown) for treating the left releasing film (waste) separated by cutting out the round-shaped releasing film 100.

The ejection module 1020 includes the ejection mechanism, a resin loader (resin loading mechanism) 1021 and an aftertreatment mechanism 1022. The ejection mechanism includes, for example, the releasing film 100, the table (fixation base, not shown) and a dispenser 200 equipped with a nozzle for ejecting the resin material. Note that, the table is not shown in FIG. 6 because of being invisible behind the dispenser 200 in the plan view (seen from above). The nozzle is not shown in FIG. 6 either because of being invisible behind the dispenser 200. In FIG. 6, the ejection mechanism further includes a film fixation base moving mechanism 1023. The table and the releasing film 100 are mounted on the film fixation base moving mechanism 1023. By moving or rotating the film fixation base moving mechanism 1023 in a horizontal direction, the table mounted thereon can be moved or rotated together with the releasing film 100. In FIG. 6, the film fixation base moving mechanism 1023 is the same as the film fixation base mounting mechanism 1011 described above, and can move between the releasing film cutting module 1010 and the ejection module 1020. The resin loader 1021 is integrated with the aftertreatment mechanism 1022. The resin loader 1021 can fit a frame (round-shaped frame) and the releasing film 100 with each other in a state where the resin material (not shown in FIG. 6) is supplied onto the releasing film 100 (onto a resin storage) which is suction-fixed to the lower end face of the frame (round-shaped frame). In this state, then the resin material can be set to be supplied into a lower die cavity for compression molding in the compression module 1030 described below, in a state where being ejected onto the releasing film 100.

As shown in FIG. 6, the compression molding module 1030 includes a molding die 1031. The molding die 1031 is not particularly limited and may be, for example, a metal die. The molding die 1031 includes an upper die and a lower die (not shown) as main components, and a lower die cavity 1032 is in a round shape as shown in FIG. 6. The molding die 1031 is provided with an upper die substrate setter (not shown) and a lower die cavity bottom surface member (not shown) for pressurizing the resin. In the compression molding module 1030, a chip (semiconductor chip, for example) attached to a substrate before resin sealing (substrate before molding) described below, is resin-sealed in a sealing resin (resin package) in the lower die cavity to form a resin-sealed substrate (molded substrate). The compression molding module 1030 may include a compression molding mechanism, for example.

The resin molding apparatus of FIG. 6 includes two compression molding modules 1030, placed between the ejection module 1020 and the conveying module 1040 to be adjacent to each other. In the resin molding apparatus of FIG. 6, the conveying module 1040 and the adjacent molding module 1030, or the ejection module 1020 and the adjacent molding module 1030, or both of these combinations are mutually detachable. Further, the two molding modules 1030 are mutually detachable. However, the resin molding apparatus of the present invention is not limited thereto and for example, may include one or three or more compression molding modules 1030.

The conveying mechanism (conveying module) 1040 can convey a substrate with the chip before resin sealing (the resin sealing object) and a resin-sealed electronic component (resin molded product). As shown in FIG. 6, the conveying mechanism (conveying module) 1040 includes a substrate loader 1041, a rail 1042, and a robot arm 1043. The rail 1042 protrudes from the conveying mechanism (conveying module) 1040 to the areas of the compression molding module 1030 and the ejection module 1020. A substrate 1044 can be mounted on the substrate loader 1041. The substrate 1044 may be a substrate before resin sealing (substrate before molding) 1044*a* or a resin-sealed substrate (molded substrate) 1044*b*. The substrate before resin sealing (substrate before molding) 1044*a* corresponds to the "resin molding object" in the performing resin molding in the method for producing the resin molded product of the present invention. The substrate loader 1041 and a resin loader 1021 (aftertreatment mechanism 1022) can move on the rail 1042, through the ejection module 1020, the compression molding module 1030, and the conveying module 1040. As shown in FIG. 6, the conveying module 1040 includes a substrate storage and can store the substrate before resin sealing (substrate before molding) 1044*a* and the resin-sealed substrate (molded substrate) 1044*b* individually. The substrate before molding 1044*a* is equipped with a chip (for example a semiconductor chip, not shown). In the molded substrate 1044*b*, the chip is sealed with a resin (sealing resin) made of a solidified resin material, thereby the electronic component (resin molded product) is formed. The robot arm 1043 can convey the substrate 1044 by supporting from below, for example. The robot arm 1043 can be used as follows, for example. Firstly, by using the robot arm 1043, the substrate before molding 1044*a* is taken out from the storage for the substrate before molding 1044*a* and turned upside down, thereby the substrate before molding 1044*a* can be mounted on the substrate loader 1041 such that the face equipped with the chip faces downward. Secondarily, by using the robot arm 1043, the molded substrate 1044*b* is taken out from the substrate loader 1041 and turned upside down, thereby the molded substrate 1044*b* can be stored in the storage for the molded substrate such that the resin-sealed side faces upward. As described below, the robot arm 1043 can also convey the molding die maintenance member by supporting from below, for example.

A controller 1050 controls cutting the releasing film, ejecting the resin material, conveying the substrate before sealing and the sealed substrate, conveying the resin material, conveying the releasing film, heating the molding die, clamping the molding die and opening the molding die. In other words, the controller 1050 controls each of the operations of the releasing film cutting module 1010, the ejection module 1020, the compression molding module 1030 and the conveying module 1040. In this way, the resin molding apparatus of the present invention may operate as a fully automatic apparatus with each of the components being controlled by the controller. The resin molding apparatus of the present invention may also operate as a manual apparatus without the controls by the controller. However, the operation with the controls of each of the components by the controller is efficient. The controller 1050 includes a calculator and a memorizer (not shown).

A position where the controller 1050 is placed is not limited to the position shown in FIG. 6 and can be freely set. For example, the controller 1050 can be placed in at least one of the modules 1010, 1020, 1030 or 1040, or can be placed at the outside of each of the modules. The controller 1050 can be structured as several controllers by separating at least a part of the controller 1050, depending on the operation to be controlled.

In the resin molding apparatus of FIG. 6, the conveying module 1040 for supplying the substrate and the ejection module 1020 for ejecting the resin material onto the releasing film are placed to be opposite to each other with the compression molding module 1030 in between, as described above. The releasing film cutting module 1010 for forming the round-shaped releasing film is placed at the outside of the ejection module 1020. This resin molding apparatus is a separable resin molding apparatus with each of the modules being separately placed. The position of each of the modules of the resin molding apparatus of the present invention is not particularly limited and may be different from the position shown in FIG. 6. For example, the required number of compression molding modules can be placed to be detachable. Also, the releasing film cutting module (round-shaped releasing film forming module), the ejection module and the conveying module (substrate module) can be collectively placed at either side next to the compression molding module. In this case, the releasing film module, the ejection module and the substrate module are parent modules, and the compression molding module is a child module (parent-child type). In this case, the required number of compression molding modules can be placed side by side. The releasing film cutting module, the ejection module and the conveying module (substrate module) may be integrated with each other. The releasing film cutting module, the ejection module, the conveying module (substrate module) and one molding module may be integrated with each other, and the entire part consisting of these integrated components operates as a single resin molding apparatus (compression molding apparatus, for example).

When placing two or more compression modules between the conveying module (substrate module) and the ejection module, and when placing two or more compression modules side by side so as to follow the parent modules, the compression modules are preferred to be placed as follows. The molding modules are each placed side by side along the rail for transferring the components including the substrate loader, the resin loader and the aftertreatment mechanism. Each of the modules of the resin molding apparatus of the present invention can be mutually detachable by utilizing a connector such as a bolt, a nut or the like, or an appropriate positioning mechanism. Also, the compression modules can be structured to be detachable to each other. This enables to increase or decrease the number of the compression modules later.

(2) Method for Producing Resin Molded Product

An example of a method for producing a resin molded product using the compression molding apparatus of FIG. 6 will be described below.

The method for producing the resin molded product of the present invention uses a molding die and includes the performing maintenance of the molding die by supplying the molding die maintenance member of the present invention to the molding die, and the performing resin molding by supplying the resin molding object and the resin material to the molding die after the performing maintenance of the molding die, as described above.

In the method for producing the resin molded product of the present invention, the performing resin molding by supplying the resin molding object and the resin material to the molding die after the performing maintenance of the molding die is not particularly limited. For example, when using the resin molding apparatus of the present invention, the performing resin molding can be done as follows. The performing maintenance of the molding die before the performing resin molding will be described below.

In the performing resin molding using the resin molding apparatus of FIG. 6, firstly, in the releasing film cutting module (releasing film cutting mechanism) 1010, the film gripper 1013 pulls out the end of the releasing film from the rolled releasing film 1012, and covers the table mounted on the film fixation mounting mechanism 1011 with the releasing film pulled out and fix the releasing film on the table, as described above, for example. In this state, the cutter (not shown) cuts the releasing film to form the round-shaped releasing film 100, as described above. The remaining releasing film (waste) after cutting out the round-shaped releasing film is treated by the waste treatment mechanism (not shown).

The film fixation base mounting mechanism 1011 (film fixation base moving mechanism 1023) is moved together with the table (not shown) and the releasing film 100 mounted on the film fixation base mounting mechanism 1011, and set underneath the resin supply port of the nozzle (not shown) in the ejection module 1020. In this state, the dispenser 200 ejects the resin material to the ejection area on the releasing film 100 (ejecting). A position of the resin ejection can be changed, by moving (or rotating) the film fixation base moving mechanism 1023 together with the table and the releasing film 100 mounted on the film fixation base moving mechanism 1023, for example.

The releasing film 100 and the resin material ejected to the ejection area thereon are moved from the film fixation base moving mechanism 1023 and retained by the resin loader (resin conveying mechanism) 1021. The releasing film 100 can be moved from the film fixation base moving mechanism 1023 to the resin loader 1021 by being retained by the retaining mechanism (not shown) of the resin loader 1021.

The robot arm 1043 takes out the substrate before molding (resin molding object) 1044*a* from the storage for the substrate before molding 1044*a* by supporting from below, and turns the taken out substrate before molding 1044*a* upside down, as described above. Thereby the substrate before molding 1044*a* is mounted on the substrate loader 1041 such that the face equipped with the chip faces downward, and conveyed into the compression molding module 1030. At this time, the substrate before molding 1044*a* is set to the die surface of the upper die (molding die 1031) for the supply. Then the resin loader 1021 retaining the releasing film 100 and the resin material moves on the rail 1042, together with the aftertreatment mechanism 1022 integrated with the reins loader 1021 and conveyed into the compression molding module 1030 (conveying). At this time, the releasing film 100 is mounted on a die surface of the lower die, thereby supplying the releasing film 100 and the resin material into the lower die cavity 1032 having a round-shaped opening.

Then the resin material is heated in the lower die cavity 1032. When using a liquid resin which is liquid at normal temperature as the resin material, viscosity of the liquid resin is lowered by this heating, for example. When using a powdery resin as the resin material, the powdery resin is melted by this heating and becomes a liquid molten resin, for example. Further, in the compression molding module 1030, the molding die 1031 (the upper die and the lower die) is clamped. Thereby, the chip attached to the substrate before molding 1044*a* set to the upper die is immersed in the resin material in the lower die cavity 1032, and the resin material in the lower die cavity 1032 can be pressed by a cavity bottom surface member. In the molding die 1031 (lower die cavity 1032), the resin material is solidified (cured by heating, for example), and the solidified resin (sealed resin) 20 is used to seal the electronic component. Thereby the resin-sealed substrate 1044*b* (molded substrate, electronic component) is formed. Then the molding die 1031 (the upper die and the lower die) is opened. The resin-sealed substrate 1044*b* is taken out and conveyed to the conveying module 1040 by the substrate loader 1041 to be stored. After taking out the resin-sealed substrate 1044*b* (molded substrate, electronic component) from the molding die 1031 by the substrate loader 1041, the substrate setter of the upper die is cleaned using an upper die cleaner (not shown) of the aftertreatment mechanism 1022. In parallel to this operation or at a different timing, the releasing film removing mechanism (not shown) of the aftertreatment mechanism can take out the releasing film which is no longer needed, from the lower die surface.

The substrate loader 1041 mounted with the resin-sealed substrate 1044*b* (electronic component) may be moved from inside the compression molding module 1030 into the conveying module 1040. In this case, by using the robot arm 1043, the resin-sealed substrate (molded substrate, electronic component) 1044*b* is taken out from the substrate loader 1041 and turned upside down, as described above. Thereby the resin-sealed substrate (molded substrate, electronic component) 1044*b* is stored in the storage for the resin-sealed substrate (molded substrate, electronic component) 1044*b* such that the resin-sealed side faces upward. In this way, the performing resin molding can be done to produce the electronic component (resin molded product).

The performing maintenance of the molding die using the resin molding apparatus of FIG. 6 before the performing resin molding can be as follows, for example.

The performing maintenance of the molding die does not use the releasing film, or the resin material ejected to the ejection area thereon, unlike the performing resin molding. In other words, the releasing film and the resin material ejected to the ejection area thereon are not supplied into the molding die 1031 or the lower die cavity 1032. Instead of the substrate before molding 1044*a*, the molding die maintenance member (not shown) is stored in the storage for the substrate before molding 1044*a* and used for the maintenance of the molding die. The molding die maintenance member is not particularly limited and may be, for example, the molding die maintenance member 10 described in FIGS. 1 to 3. The molding die maintenance member of FIGS. 1 to 3 shows an example of the molding die maintenance resin 12 being placed on both faces of the support 11. However, the molding die maintenance member is not limited thereto and for example, the molding die maintenance resin 12 may be placed on only one surface of the support 11.

The molding die maintenance member is taken out from the storage for the substrate before molding (resin molding object) 1044*a* by the robot arm 1043 supporting from below. The molding die maintenance member taken out from the storage for the substrate before molding 1044*a* is mounted on the substrate loader 1041 by the robot arm 1043 and conveyed into the compression molding module 1030. At this time, the molding die maintenance member is set to the die surface of the upper die (molding die 1031) for the supply.

In the compression molding module 1030, the molding die 1031 (the upper die and the lower die) is clamped. Thereafter the molding die maintenance resin of the molding die maintenance member is preformed by being heated with heat of the molding die, thereby the maintenance of the molding die is performed. For the maintenance of the molding die, a cleaning resin may be used as the molding die maintenance resin to clean the inside of the lower die cavity 1032, for example. For the maintenance of the molding die, a releasability recovering resin may be used as the molding die maintenance resin to recover releasability of the inside of the lower die cavity 1032. Then the molding die 1031 (the upper die and the lower die) is opened. The used molding die maintenance member (not shown) is taken out and conveyed to the conveying module 1040 by the substrate loader 1031 to be stored.

The substrate loader 1041 mounted with the used molding die maintenance member may be moved from inside the compression molding module 1030 into the conveying module 1040. In this case, the used molding die maintenance member is taken out from the substrate loader 1041 and turned upside down by the robot arm 1043. Thereby the used molding die maintenance member is stored in the storage for the resin-sealed substrate (molded substrate, electronic component) 1044*b*. In this way the performing maintenance of the molding die can be done. As such a series of an operation, the performing maintenance of the molding die may be done using the cleaning resin as the molding die maintenance resin for one or two more times, and thereafter performed using the releasability recovering resin as the molding die maintenance resin, for example.

The operation was described above with reference to the example of storing the molding die maintenance member in the storage for the substrate before molding 1044*a*, and storing the used molding die maintenance member in the storage for the resin-sealed substrate 1044*b*. However, the present invention is not limited thereto, and a storage for the molding die maintenance member may be provided separately from the storage for the substrate before molding 1044*a*, and a storage for used molding die maintenance member may be provided separately from the storage for the resin-sealed substrate 1044*b*. In this case, the storage for the substrate before molding 1044*a* may store the substrate begore molding 1044*a*, and the substrate for the resin-sealed substrate 1044*b* may store the resin-sealed substrate 1044*b*. When providing the storage for the molding die maintenance member separately from the storage for the substrate before molding 1044*a*, a position of the storage for the molding die maintenance member is not particularly limited and may be anywhere. The position of the storage for the molding die maintenance member may be, for example, near the storage for the substrate before molding 1044*a*, a part of the conveying module 1040 or a part of the controller 1050. In the same way, when providing the storage for the used molding die maintenance member separately from the storage for the resin-sealed substrate 1044*b*, a position of the storage for the used molding die maintenance member is not particularly limited and may be anywhere. The position of the storage for the used molding die maintenance resin may be, for example, near the storage for the resin-sealed substrate 1044*b*, a part of the conveying module 1040 or a part of the controller 1050.

FIG. 6 showed the example that only the lower die of the molding die includes the die cavity, and the molding die maintenance member is set to the die surface of the upper die for the supply. In such a case, as described above, the molding die maintenance resin may be placed on only one surface of the support in the molding die maintenance member, and may perform the maintenance of the lower die cavity, for example. However, the present invention is not limited thereto. For example, when only the lower die of the molding die includes the die cavity, or when both of the upper die and the lower die of the molding die include the die cavity, the molding die maintenance member in which the molding die maintenance resins are placed on both faces of the support may be used to perform the maintenance of both of the upper die and the lower die using the molding die maintenance resin.

The example of using the releasing film in the performing resin molding in the method for producing the resin molded product was described with reference to FIG. 6. However, the present invention is not limited thereto, and the releasing film may not necessarily be used in the performing resin molding.

The example that the conveying mechanism (conveying module 1040) for the substrate also works as the conveying mechanism for the molding die maintenance member was described with reference to FIG. 6. However, the resin molding apparatus of present invention is not limited thereto, and the conveying mechanism for the molding die maintenance member may be provided separately from the conveying mechanism for the substrate.

The electronic component producing apparatus and the method for producing the electronic component using the apparatus was described with reference to FIG. 6. However, the present invention is not limited to the electronic component, and may be applied to productions of any other resin molded products. The present invention can be applied for producing, for example, a lens, an optical module, an optical component such as a light guide plate or the like or other resin molded products using compression molding.

The present invention is not limited to the above-described embodiments. Various combination, changes, and selections may be made freely and appropriately in the configuration and specifics of the present invention without departing from the scope of the present invention.

This application claims priority from Japanese Patent Application No. 2021-099001 filed on Jun. 14, 2021. The entire subject matter of the Japanese Patent Application is incorporated herein by reference.

REFERENCE SIGNS LIST

10 molding die maintenance member
11 support
11*a* roughened surface of support 11
11*b* recessed part of support 11
12 molding die maintenance resin
13 adhesive layer
14 mask
20 sealing resin
100 releasing film (ejecting object)
200 dispenser
1000 resin molding apparatus
1010 releasing film cutting module (releasing film cutting mechanism)
1011 film fixation base mounting mechanism
1012 rolled releasing film
1013 film gripper
1020 ejection module (ejection mechanism)
1021 resin loader
1022 aftertreatment mechanism
1023 film fixation base moving mechanism
1030 compression molding module (compression molding mechanism)
1031 molding die
1032 lower die cavity
1040 conveying module (conveying mechanism)
1041 substrate loader
1042 rail
1043 robot arm
1044*a* substrate begore resin sealing (substrate before molding)
1044*b* resin-sealed substrate (molded substrate)
1050 controller

The invention claimed is:

1. A method for producing a resin molded product, comprising:
conveying a molding die maintenance member including a plate-like support and a molding die maintenance resin placed on both surfaces of the support, from a common storage for the molding die maintenance member and a substrate, to a molding die for resin molding including an upper die and a lower die, by a conveying mechanism;
clamping the molding die in a state where the molding die maintenance member is placed between the upper die and the lower die of the molding die;
performing maintenance by heating the molding die maintenance member after the clamping the molding die;
conveying the molding die maintenance member from the molding die by the conveying mechanism;
conveying the substrate from the storage to the molding die by the conveying mechanism, and clamping the molding die in a state where the substrate is placed between the upper die and the lower die of the molding die, wherein at least one surface of the support is roughened, the molding die maintenance resin is placed on the roughened surface, the roughened surface is roughened by forming recessed parts, and a diameter of a part inside the recessed part is larger than a diameter of an opening of the recessed part.

2. The method according to claim 1, wherein the support is subjected to treatment for improving joint strength to the molding die maintenance resin.

3. The method according to claim 1, wherein the molding die maintenance member includes an adhesive layer, and the molding die maintenance resin is adhered to at least one surface of the support via the adhesive layer.

4. The method according to claim 1, wherein the molding die maintenance resin is a cleaning resin.

5. The method according to claim 1, wherein the molding die maintenance resin is a releasability recovering resin.

* * * * *